United States Patent
Mori et al.

(10) Patent No.: US 11,753,739 B2
(45) Date of Patent: *Sep. 12, 2023

(54) METHOD FOR MANUFACTURING A GROUP III-NITRIDE CRYSTAL COMPRISING SUPPLYING A GROUP III-ELEMENT OXIDE GAS AND A NITROGEN ELEMENT-CONTAINNG GAS AT A SUPERSATION RATIO OF GREATER THAN 1 AND EQUAL TO OR LESS THAN 5

(71) Applicants: OSAKA UNIVERSITY, Osaka (JP); PANASONIC HOLDINGS CORPORATION, Osaka (JP)

(72) Inventors: Yusuke Mori, Osaka (JP); Masashi Yoshimura, Osaka (JP); Masayuki Imanishi, Osaka (JP); Akira Kitamoto, Osaka (JP); Junichi Takino, Osaka (JP); Tomoaki Sumi, Osaka (JP)

(73) Assignees: PANASONIC HOLDINGS CORPORATION, Osaka (JP); OSAKA UNIVERSITY, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/479,516

(22) Filed: Sep. 20, 2021

(65) Prior Publication Data
US 2022/0056614 A1 Feb. 24, 2022

Related U.S. Application Data (63) Continuation of application No. 16/776,647, filed on Jan. 30, 2020, now Pat. No. 11,155,931.

(30) Foreign Application Priority Data

Feb. 4, 2019 (JP) .................................. 2019-018035

(51) Int. Cl.
*C30B 25/16* (2006.01)
*C30B 29/40* (2006.01)

(52) U.S. Cl.
CPC .......... *C30B 25/165* (2013.01); *C30B 29/403* (2013.01)

(58) Field of Classification Search
CPC ......... C30B 25/00; C30B 25/02; C30B 25/10; C30B 25/16; C30B 25/165; C30B 25/18;
(Continued)

(56) References Cited

U.S. PATENT DOCUMENTS 11,155,931 B2 * 10/2021 Mori ..................... C30B 25/165
2016/0090304 A1 3/2016 Mori et al.
(Continued)

FOREIGN PATENT DOCUMENTS

JP 2016-64973 4/2016
JP 2016-069267 5/2016
(Continued)

OTHER PUBLICATIONS

Hoshino, et al. publication entitled "Effect of low-temperatuer GaN buffer layer on the crystalline quality of subsequent GaN layers grown by MOVPE," Journal of Crystal Growth, vol. 298, pp. 232-234 (2007). (Year: 2007).*
(Continued)

*Primary Examiner* — Kenneth A Bratland, Jr.
(74) *Attorney, Agent, or Firm* — WENDEROTH, LIND & PONACK L.L.P.

(57) ABSTRACT

A method of manufacturing a group-III nitride crystal includes: preparing a seed substrate; and supplying a group-III element oxide gas and a nitrogen element-containing gas at a supersaturation ratio ($P^o/P^e$) greater than 1 and equal to or less than 5, then, growing a group-III nitride crystal on the seed substrate, wherein the $P^o$ is a supply partial pressure of
(Continued)

the group-III element oxide gas, and the $P^e$ is an equilibrium partial pressure of the group-III element oxide gas.

6 Claims, 4 Drawing Sheets

(58) Field of Classification Search
CPC ....... C30B 25/183; C30B 25/20; C30B 29/00; C30B 29/10; C30B 29/38; C30B 29/403; C23C 16/22; C23C 16/30; C23C 16/301; C23C 16/303
USPC ........ 117/84, 88–89, 94, 102, 105–106, 937, 117/952
See application file for complete search history.

(56) References Cited

U.S. PATENT DOCUMENTS

| 2016/0090665 A1* | 3/2016 | Okayama | C30B 25/14 117/88 |
| 2016/0268129 A1* | 9/2016 | Mori | H01L 21/02645 |
| 2017/0321348 A1 | 11/2017 | Mori et al. | |
| 2018/0094361 A1 | 4/2018 | Mori et al. | |

FOREIGN PATENT DOCUMENTS

| JP | 2018-58718 | 4/2018 |
| WO | 2015/053341 | 4/2015 |
| WO | 2016/068181 | 5/2016 |

OTHER PUBLICATIONS

Notice of Reasons for Refusal dated Jul. 26, 2022, in corresponding Japanese Patent Application No. 2019-018035, with English translation.

Prof. Dr. Ing. Ihsan. Barin, "Thermochemical Data of Pure Substances, Third Edition", Wiley-VCH Verlag GmbH, Thermochemical Data of Ga:P729, Ga2O:P741, H2:P782, H2O:P796, N2:P1081, NH3:P1088, Apr. 24, 2008, cited in the specification.

Hoshino, et al. publication entitled "Effect of low-temperature GaN buffer layer on the crystalline quality of subsequent GaN layers grown by MOVPE," Journal of Crystal Growth, vol. 298, pp. 232-234 (2007). (Year: 2007).

* cited by examiner

METHOD FOR MANUFACTURING A GROUP III-NITRIDE CRYSTAL COMPRISING SUPPLYING A GROUP III-ELEMENT OXIDE GAS AND A NITROGEN ELEMENT-CONTAINNG GAS AT A SUPERSATION RATIO OF GREATER THAN 1 AND EQUAL TO OR LESS THAN 5

BACKGROUND OF THE INVENTION

Cross-Reference to Related Applications

This application claims a priority of Japanese Patent Application No. 2019-18035 filed on Feb. 4, 2019, the contents of which is incorporated herein by reference.

BACKGROUND

1. Technical Field

The present invention relates to a method of manufacturing a group-III nitride crystal.

2. Description of the Related Art

Group-III nitride crystals are used for heterojunction high-speed electronic devices in a power semiconductor field etc. and photoelectron devices in LED and laser fields etc. an oxide vapor-phase growth method using a group-III oxide as a raw material has been devised as a method of manufacturing a group-III nitride crystal, (see, e.g., WO 2015/053341 A1). The reaction system in this oxide vapor-phase growth method is as follows. First, Ga is heated, and $H_2O$ gas is introduced in this state. The introduced $H_2O$ gas reacts with Ga to generate $Ga_2O$ gas (Formula (I) below). $NH_3$ gas is introduced and reacted with the generated $Ga_2O$ gas to generate a GaN crystal on a seed substrate (Formula (II) below).

$$2Ga + H_2O \rightarrow Ga_2O + H_2 \quad (I)$$

$$Ga_2O + 2NH_3 \rightarrow 2GaN + H_2O + 2H_2 \quad (II)$$

However, conventional manufacturing methods cause polycrystallization in which a plane different from a growth plane is oriented at the time of growth of a group-III nitride crystal, which makes it difficult to produce a high-quality crystal uniformly within the growth plane.

SUMMARY

It is therefore one non-limiting and exemplary embodiment provides a method of manufacturing a group-III nitride crystal suppressing the polycrystallization to improve the quality of the group-III nitride crystal.

In one general aspect, the techniques disclosed here feature: a method of manufacturing a group-III nitride crystal includes:

preparing a seed substrate; and supplying a group-III element oxide gas and a nitrogen element-containing gas at a supersaturation ratio ($P^o/P^e$) greater than 1 and equal to or less than 5, then, growing a group-III nitride crystal on the seed substrate, wherein the $P^o$ is a supply partial pressure of the group-III element oxide gas, and the $P^e$ is an equilibrium partial pressure of the group-III element oxide gas.

The method of manufacturing a group-III nitride crystal according to the present invention can improve the quality of the obtained group-III nitride crystal.

Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

BRIEF DESCRIPTION OF DRAWINGS

The present disclosure will become readily understood from the following description of non-limiting and exemplary embodiments thereof made with reference to the accompanying drawings, in which like parts are designated by like reference numeral and in which.

DETAILED DESCRIPTION

A method of manufacturing a group-III nitride crystal according to a first aspect includes:

preparing a seed substrate; and supplying a group-III element oxide gas and a nitrogen element-containing gas at a supersaturation ratio ($P^o/P^e$) greater than 1 and equal to or less than 5, then, growing a group-III nitride crystal on the seed substrate, wherein the $P^o$ is a supply partial pressure of the group-III element oxide gas, and the $P^e$ is an equilibrium partial pressure of the group-III element oxide gas.

The method of manufacturing a group-III nitride crystal according to a second aspect, in the first aspect, wherein in the step of supplying the group-III element oxide gas and the nitrogen element-containing gas, the group-III element oxide gas and the nitrogen element-containing gas are supplied from a temperature lower than a substrate temperature of the growing step to introduce a group-III nitride crystal decomposition suppression layer.

The method of manufacturing a group-III nitride crystal according to a third aspect, in the first aspect, wherein in the step of supplying the group-III element oxide gas and the nitrogen element-containing gas, the supersaturation ratio ($P^o/P^e$) may be set to equal to or greater than 1.3 and less than 2.5.

The method of manufacturing a group-III nitride crystal according to a fourth aspect, in the first aspect, wherein in the step of supplying the group-III element oxide gas and the nitrogen element-containing gas, the supersaturation ratio ($P^o/P^e$) is set to equal to or greater than 1.3 and less than 2.5, and the group-III element oxide gas and the nitrogen element-containing gas are supplied from a substrate temperature of the seed substrate of 1050° C. or less to introduce a group-III nitride crystal decomposition suppression layer.

BACKGROUND TO THE PRESENT INVENTION

The method of manufacturing a group-III nitride crystal according to the present disclosure includes: supplying a reactive gas to a starting group-III element source; reacting the starting group-III element source with the reactive gas to generate an oxide gas of the group-III element; supplying the group-III element oxide gas into a growth chamber; supplying a nitrogen element-containing gas into the growth chamber; supplying an oxidizable gas into the growth chamber; reacting the group-III element oxide gas with the nitrogen element-containing gas in an atmosphere of the oxidizable gas to generate a group-III nitride crystal; reacting the oxidizable gas with a substance containing an oxygen element present in the growth chamber to generate an oxide gas; and discharging an unreacted gas out of the growth chamber.

In this method of manufacturing a group-III nitride crystal, a supersaturation ratio ($P^o/P^e$) determining a crystal nucleation frequency on a substrate can be controlled by adjusting a generation amount of the group-III element oxide gas generated at the group-III element oxide gas generation step to adjust a supply amount of the group-III oxide gas supplied to the group-III nitride generation step at the group-III element oxide gas supply step and adjusting a supply amount of the nitrogen element-containing gas supplied from the nitrogen element-containing gas supply step to the group-III nitride crystal generation step. Therefore, the present inventors found that problematic polycrystallization can be suppressed to improve quality of group-III nitride crystals by controlling the supersaturation ratio ($P^o/P^e$), thereby completing the present invention. $P^o$ is a supply partial pressure of the group-III oxide gas determining a drive force of growth of the group-III nitride crystal, and $P^e$ is an equilibrium partial pressure of the group-III oxide gas.

A method of manufacturing a group-III nitride crystal according to an embodiment will now be described with reference to the accompanying drawings. In the drawings, substantially the same members are denoted by the same reference numerals.

First Embodiment

<Overview of Method of Manufacturing Group-III Nitride Crystal>

Figure 1:
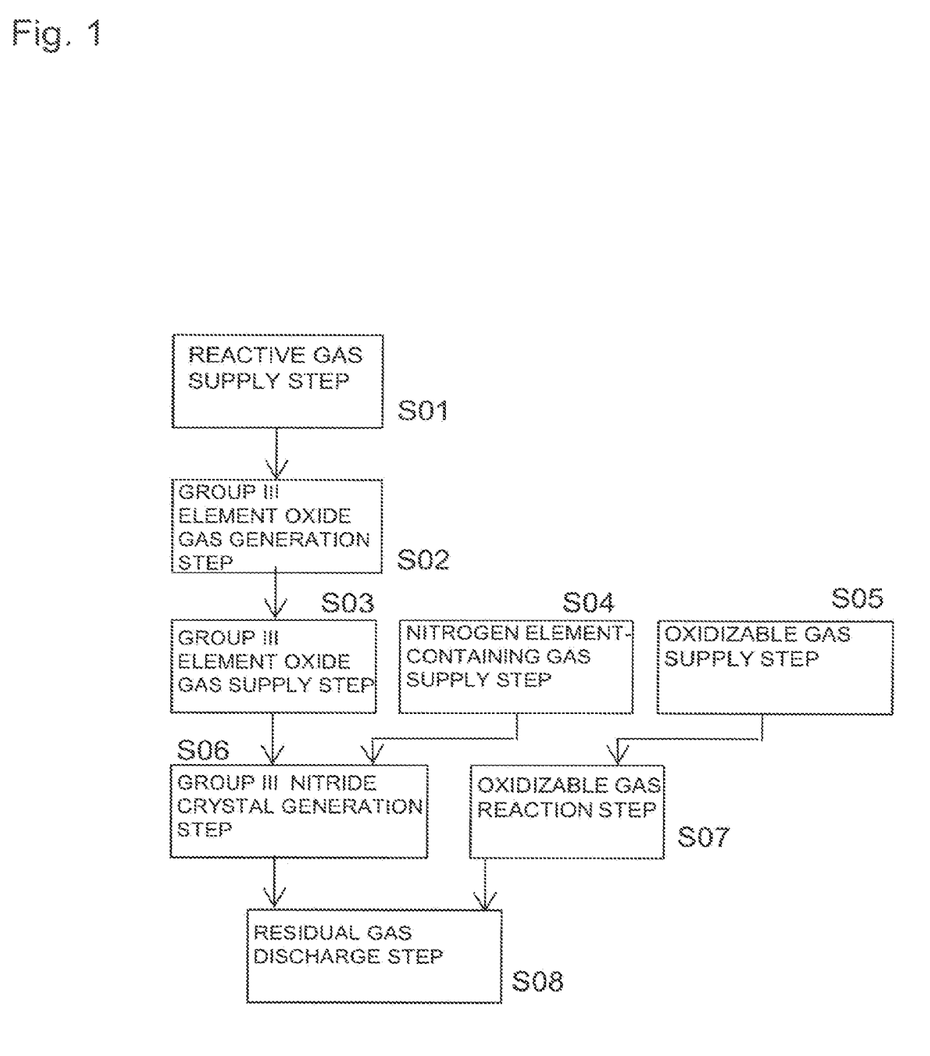
FIG. 1 is a flowchart of a method of manufacturing a group-III nitride crystal according to a first embodiment.

An overview of a method of manufacturing a group-III nitride crystal according to a first embodiment of the present disclosure will be described with reference to a flowchart of FIG. 1. The method of manufacturing a group-III nitride crystal according to the first embodiment includes a reactive gas supply step (S01), a group-III element oxide gas generation step (S02), a group-III element oxide gas supply step (S03), a nitrogen element-containing gas supply step (S04), an oxidizable gas supply step (S05), a group-III nitride crystal generation step (S06), an oxidizable gas reaction step (S07), and a residual gas discharge step (S08).

(1) At the reactive gas supply step, a reactive gas is supplied to a raw material reaction chamber (S01).

(2) At the group-III element oxide gas generation step, a starting group-III element source is reacted with a reactive gas (a reducing gas when the starting group-III element source is an oxide, or an oxidizing gas when the source is a metal) to generate a group-III element oxide gas (S02).

(3) At the group-III element oxide gas supply step, the group-III element oxide gas manufactured at the group-III element oxide gas generation step is supplied to a growth chamber (S03).

(4) At the nitrogen element-containing gas supply step, a nitrogen element-containing gas is supplied to the growth chamber (S04).

(5) At the oxidizable gas supply step, an oxidizable gas is supplied to the growth chamber (S05).

(6) At the group-III nitride crystal generation step, the group-III element oxide gas supplied into the growth chamber at the group-III element oxide gas supply step is reacted with the nitrogen element-containing gas supplied into the growth chamber at the nitrogen element-containing gas supply step to manufacture a group-III nitride crystal (S06).

(7) At the oxidizable gas reaction step, an oxide other than the group-III element oxide gas supplied into the growth chamber is reacted with the oxidizable gas to prevent oxygen from mixing into the group-III nitride crystal (S07).

(8) At the residual gas discharge step, an unreacted gas not contributing to the generation of the group-III nitride crystal is discharged out of the chamber (S08).

Through the steps described above, the group-III nitride crystal can be generated on the seed substrate.

<Overview of Group-III Nitride Crystal Manufacturing Apparatus>

An overview of a group-III nitride crystal manufacturing apparatus 150 according to the first embodiment of the present disclosure will be described with reference to a schematic showing a configuration of the group-III nitride crystal manufacturing apparatus 150 of FIG. 2. It is noted that constituent members shown in FIG. 2 may be different from actual members in terms of size, ratio, etc. In the group-III nitride crystal manufacturing apparatus 150 according to the first embodiment, a raw material reaction chamber 101 is disposed in a raw material chamber 100, and a raw material boat 104 with a starting group-III element source 105 placed therein is disposed in the raw material reaction chamber 101. A reactive gas supply pipe 103 supplying a gas reactive with the starting group-III element source 105 is connected to the raw material reaction chamber 101, and the raw material reaction chamber 101 has a group-III oxide gas discharge port 107. The reactive gas is a reducing gas when the starting group-III source is an oxide or an oxidizing gas when the source is a metal. The raw material chamber 100 includes a first carrier gas supply port 102, and the group-III oxide gas and a carrier gas flow from a group-III oxide gas and carrier gas discharge port 108 through a connection pipe 109 into a growth chamber 111. The growth chamber 111 has a group-III oxide gas and carrier gas supply port 118, an oxidizable gas supply port 113, a nitrogen element-containing gas supply port 112, a second carrier gas supply port 114, and an exhaust port 119 and comprises substrate susceptor 117 on which a seed substrate 116 is disposed.

<Details of Manufacturing Method and Manufacturing Apparatus>

Details of the method of manufacturing a group-III nitride crystal according to the first embodiment will be described with reference to FIG. 2.

A metal Ga is used as the starting group-III element source 105 in this description.

(1) At the reactive gas supply step, the reactive gas is supplied from the reactive gas supply pipe 103 to the raw material reaction chamber 101.

(2) At the group-III element oxide gas generation step, the reactive gas supplied to the raw material reaction chamber 101 at the reactive gas supply step reacts with the metal Ga serving as the starting group-III element source 105 to generate a Ga$_2$O gas that is the group-III oxide gas. The generated Ga$_2$O gas is discharged from the raw material reaction chamber 101 through the group-III oxide gas discharge port 107 to the raw material chamber 100. The discharged Ga$_2$O gas is mixed with a first carrier gas supplied from the first carrier gas supply port 102 to the raw material chamber and is supplied to the group-III oxide gas and carrier gas discharge port 108. At this step, a first heater 106 is set to a temperature equal to or greater than 800° C. from the viewpoint of the boiling point of the Ga$_2$O gas and lower than 1800° C. so that the temperature is lower than a second heater 115. A starting Ga source is placed in the raw material boat 104. The raw material boat 104 has, for example, a shape capable of increasing a contact area between the reactive gas and the starting Ga source.

Methods of generating the group-III oxide gas are roughly classified into a method of reducing the starting Ga source 105 and a method of oxidizing the starting Ga source 105. For example, in the reducing method, an oxide (e.g., Ga$_2$O$_3$) is used as the starting Ga source 105, and a reducing gas (e.g., H$_2$ gas, CO gas, CH$_4$ gas, C$_2$H$_6$ gas, H$_2$S gas, SO$_2$ gas) is used as the reactive gas. On the other hand, in the oxidizing method, a non-oxide (e.g., liquid Ga) is used as the starting Ga source 105, and an oxidizing gas (e.g., H$_2$O gas, O$_2$ gas, CO gas) is used as the reactive gas. In addition to the starting Ga source 105, an In source and an Al source can be employed as the starting group-III element. For the first carrier gas, an inert gas or H$_2$ gas is usable.

(3) At the group-III element oxide gas supply step, the Ga$_2$O gas generated at the group-III element oxide gas generation step is supplied through the group-III oxide gas and carrier gas discharge port 108, the connection pipe 109, and the group-III oxide gas and carrier gas supply port 118 to the growth chamber 111. When the temperature of the connection pipe 109 connecting the raw material chamber 100 and the growth chamber 111 is lower than the temperature of the raw material chamber 100, a reverse reaction of the reaction for generating the group-III oxide gas occurs, and the starting Ga source 105 precipitates inside the connection pipe 109. Therefore, the connection pipe 109 is heated by a third heater 110 to a temperature higher than the first heater 106 so as not to become lower than the temperature of the raw material chamber 100.

(4) At the nitrogen element-containing gas supply step, the nitrogen element-containing gas is supplied from the nitrogen element-containing gas supply port 112 to the growth chamber 111. NH$_3$ gas, NO gas, NO$_2$ gas, N$_2$H$_2$ gas, N$_2$H$_4$ gas, etc. are usable as the nitrogen element-containing gas.

(5) At the oxidizable gas supply step, the oxidizable gas is supplied from the oxidizable gas supply port 113 to the growth chamber 111. The reason for supplying the oxidizable gas is to reduce an oxide gas other than the group-III oxide gas (the oxidizable gas reaction step). B gas, Ga gas, In gas, Tl gas, etc. are usable as the oxidizable gas from the viewpoint of reactivity with the oxide gas other than the Ga source. Additionally, CH$_4$ gas, C$_2$H$_6$ gas, C$_3$H$_8$ gas, C$_4$H$_{10}$ gas, C$_2$H$_4$ gas, C$_3$H$_6$ gas, C$_4$H$_8$ gas, C$_2$H$_2$ gas, C$_3$H$_4$ gas, HCN gas, etc. may be usable as the oxidizable gas.

(6) At the group-III nitride crystal generation step, the raw material gases supplied through the supply steps into the growth chamber are combined to manufacture a group-III nitride crystal. The growth chamber 111 is heated by the second heater 115 to a temperature at which the group-III oxide gas reacts with the nitrogen element-containing gas. In this case, the growth chamber 111 is heated to a temperature not lower than the temperature of the raw material chamber 100 so as to prevent the reverse reaction of the reaction for generating the group-III oxide gas. Therefore, the temperature of the second heater 115 is set to 1000° C. to 1800° C. The second heater 115 and the third heater 110 are set to the same temperature so as to suppress temperature fluctuations of the growth chamber 111 due to the Ga$_2$O gas generated in the raw material chamber 100 and the first carrier gas.

By mixing the group-III oxide gas supplied to the growth chamber 111 through the group-III element oxide gas supply step and the nitrogen element-containing gas supplied to the growth chamber 111 through the nitrogen element-containing gas supply step upstream of the seed substrate 116, the group-III nitride crystal can be grown on the seed substrate 116.

For improving the quality of the group-III nitride crystal to be grown, suppression of polycrystallization is required. A supersaturation ratio (P$^o$/P$^e$) is considered as a quantitative parameter for an amount of generation of polycrystals. From the viewpoint of reducing the nucleation frequency to suppress the polycrystallization, the supply amounts of the group-III oxide gas and the nitrogen element-containing gas may be set such that the supersaturation ratio is greater than 1 and not greater than 5. Furthermore, the supersaturation ratio may be greater than 1 and not greater than 2.5, further, for example, not less than 1.3 and less than 2.5.

P$^e$ is the equilibrium partial pressure of the group-III oxide gas (e.g., Ga$_2$O), and P$^o$ is the supply partial pressure of the group-III oxide gas. P$^e$ can be acquired as the partial pressure of the group-III oxide gas relative to the total pressure in the equilibrium state by calculating the equilibrium partial pressures of the gases by using thermodynamic analysis in reaction formulae represented by Formulae (III) and (IV). On the other hand, P$^o$ can be acquired as the ratio of the group-III oxide gas flow rate to the total flow rate of the gases supplied into the growth chamber. The same applies to the group-III oxide gas that is a compound of In or Al.

$$Ga_2O + 2NH_3 \rightarrow 2GaN + H_2O + 2H_2 \quad (III)$$

$$Ga_2O + H_2 \rightarrow 2Ga + H_2O \quad (IV)$$

Figure 6:
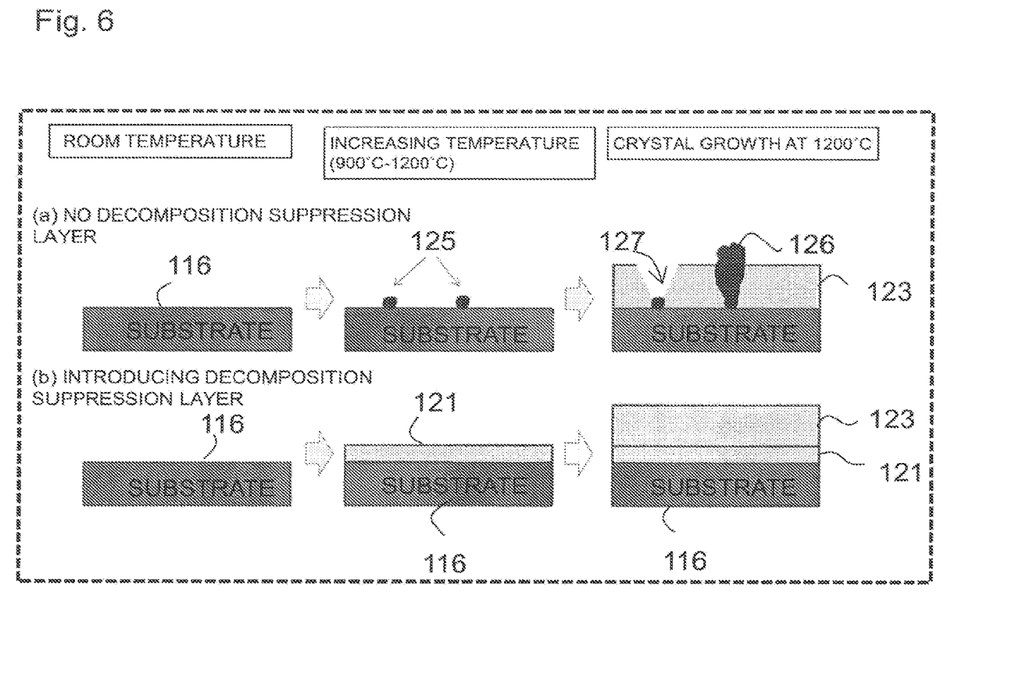
FIG. 6 is a diagram showing (a) a schematic cross-sectional view showing an example of crystal growth when the decomposition suppression layer is not introduced and (b) a schematic cross-sectional view showing an example of crystal growth when the decomposition suppression layer is introduced.

Thermal decomposition of a substrate will be described. Considering the use of gallium nitride for the seed substrate, even if the thermal decomposition of gallium nitride is suppressed in a supply atmosphere of the nitrogen element-containing gas (e.g., NH$_3$ gas), the thermal decomposition tends to occur at atmospheric pressure and 1050° C. or higher. If the thermal decomposition occurs, Ga droplets and gallium nitride having orientation different from the growth plane are generated on the substrate and serve as sources of abnormal growth such as polycrystallization and generation of pits (FIG. 6(a)).

Therefore, in the case of gallium nitride, the crystal may be grown from a stage where the substrate temperature reaches 1050° C. from the viewpoint of suppression of decomposition. Furthermore, considering suppression of abnormal sources attributable to thermal decomposition on the substrate, the crystal may be grown from a stage where the substrate temperature reaches 1000° C., and further, the crystal is grown from a stage where the substrate temperature reaches, for example, 900° C. At the time of growing, the supersaturation ratio may be controlled as described above from the viewpoint of suppression of polycrystallization.

In this case, to suppress decomposition of the nitrogen element-containing gas due to heat from the growth chamber 111, the nitrogen element-containing gas supply port 112 and an outer wall of the growth chamber 111 may be covered with a heat insulator.

Parasitic growth of the group-III nitride crystal onto a furnace wall of the growth chamber 111 and the substrate susceptor 117 is considered as a problem. Therefore, the concentrations of the group-III oxide gas and the nitrogen element-containing gas can be controlled by the carrier gas supplied from the second carrier gas supply port 114 to the growth chamber 111 to suppress the parasitic growth of the group-III nitride crystal to the furnace wall of the growth chamber 111 and the substrate susceptor 117.

For the seed substrate 116, for example, gallium nitride, gallium arsenide, silicon, sapphire, silicon carbide, zinc oxide, gallium oxide, or ScAlMgO$_4$ is usable.

An inert gas or H$_2$ gas is usable as the second carrier gas.

Additionally, the oxidizable gas is supplied into the growth chamber 111 through the oxidizable gas supply step so as to reduce the oxygen concentration of the group-III nitride crystal. The oxide gas other than the Ga source supplied to the growth chamber 111 through the group-III oxide gas generation step and the group-III oxide gas supply step causes an increase in the oxygen concentration of the group-III nitride crystal. Therefore, oxygen can be prevented from mixing into the crystal by reacting the oxide gas other than the Ga source with the oxidizable gas before arriving at the seed substrate 116. For example, if In gas is used as the oxidizable gas and reacted with H$_2$O that is the oxide gas other than the Ga source, the In gas reacts with the H$_2$O gas to generate In$_2$O gas and H$_2$ gas. The In$_2$O gas is extremely hardly taken into a solid at a growth temperature exceeding 1000° C. as in the method of manufacturing a group-III nitride crystal according to the first embodiment.

The unreacted group-III oxide gas, nitrogen element-containing gas, carbon element-containing gas, oxidizable gas, and carrier gas are discharged from the exhaust port 119 (the residual gas discharge step).

<Decomposition Suppression Layer>

Figure 4:
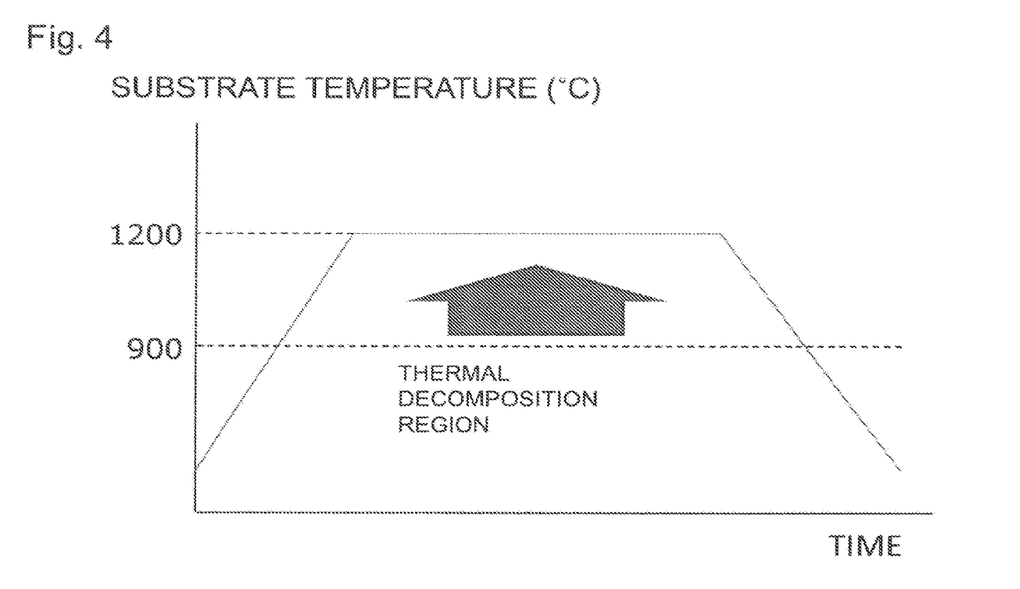
FIG. 4 is a graph showing a temperature rise profile of substrate temperature.
Figure 5:
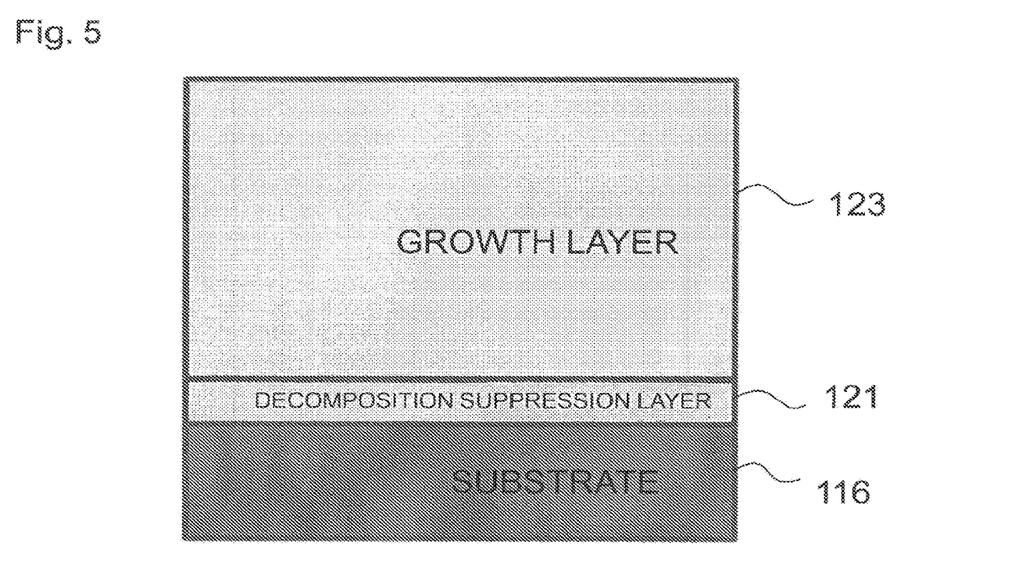
FIG. 5 is a schematic when crystals are grown on a decomposition suppression layer disposed on a seed substrate.

In this method of manufacturing a group-III nitride crystal, a decomposition suppression layer 121 may be introduced immediately above the seed substrate 116. FIG. 4 shows a temperature rise profile of the substrate temperature. In this example, a substrate attainment temperature is 1200° C. While the thermal decomposition in the case of using gallium nitride for the seed substrate has been described above, gallium nitride undergoes thermal decomposition at a substrate temperature of 900° C. or higher even when NH$_3$ gas is supplied as an N source. Therefore, to suppress the thermal decomposition of gallium nitride, the group-III oxide gas may be supplied from the thermal decomposition temperature to start the growth of gallium nitride. A layer deposited in the process of raising the temperature from the thermal decomposition temperature to a desired substrate temperature is referred to as a decomposition suppression layer (FIG. 5). Therefore, the decomposition suppression layer 121 is a group-III nitride layer grown at a temperature lower than a growth layer 123. The decomposition suppression layer 121 is grown with a degree of lattice mismatch made equal to or less than 0.01% by controlling the concentration of oxygen mixed in the crystal so as not to cause lattice mismatch with the seed substrate 116. The concentration of oxygen in the crystal can be controlled by changing the supply amount of the Ga$_2$O gas. As a result, the thermal decomposition of gallium nitride is suppressed, and the sources of pits and abnormal growth are suppressed.

FIG. 6(a) is a schematic cross-sectional view showing an example of crystal growth when the decomposition suppression layer is not introduced, and FIG. 6(b) is a schematic cross-sectional view showing an example of crystal growth when the decomposition suppression layer is introduced. The effect of the presence/absence of the decomposition suppression layer 121 will be described with reference to FIG. 6. As shown in FIG. 6(a), when the decomposition suppression layer 121 is not introduced, the thermal decomposition of the substrate 116 occurs when the substrate 116 is increased in temperature (900° C. to 1200° C.), so that abnormal growth sources 125 are generated. The abnormal growth sources 125 are a group-III element droplet and a crystal having orientation different from the growth plane of the group-III nitride to be grown, for example. The abnormal growth sources 125 cause generation of a polycrystal 126 and a pit 127 during subsequent growth of the growth layer 123 of the group-III nitride crystal at 1200° C. In contrast, as shown in FIG. 6(b), when the decomposition suppression layer 121 is introduced, the decomposition suppression layer 121 functions as a protective layer to prevent the thermal decomposition of the substrate 116 when the substrate is increased in temperature (900° C. to 1200° C.), thereby suppressing the generation of the abnormal growth sources 125. As a result, the generation of the polycrystal 126 and the pit 127 can be suppressed even during subsequent growth of the growth layer 123 of the group-III nitride crystal at 1200° C.

As described above, the polycrystallization of the group-III nitride crystal can be suppressed, and the crystal quality is improved.

(Overviews of Examples and Comparative Examples)

Figure 2:
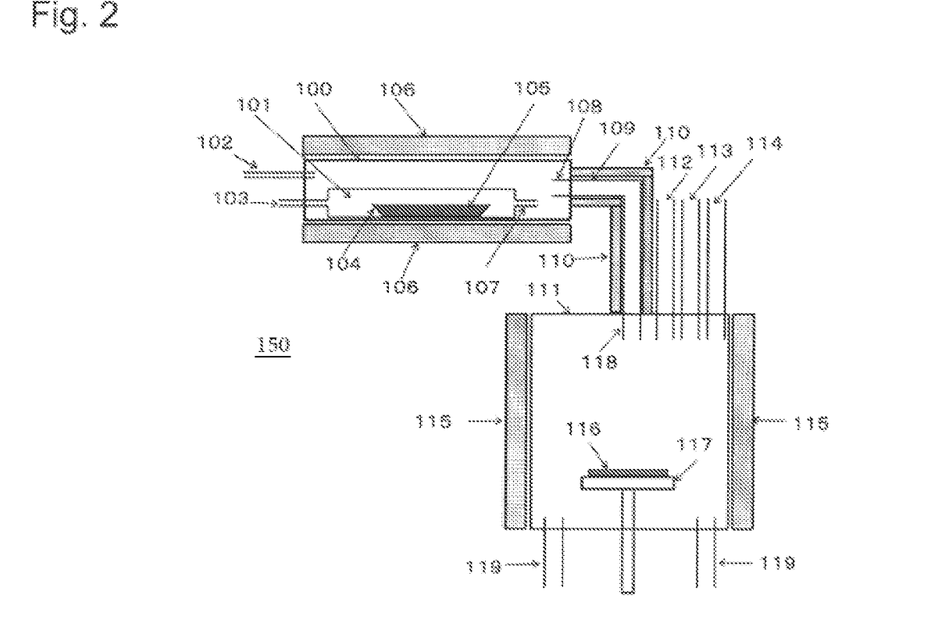
FIG. 2 is a schematic showing a configuration of a group-III nitride crystal manufacturing apparatus according to the first embodiment.

Group-III nitride crystals were grown by using a growth furnace that is the group-III nitride crystal manufacturing apparatus 150 shown in FIG. 2. GaN was grown as the group-III nitride crystals. Liquid Ga was used as the starting Ga source, Ga was reacted with H$_2$O gas that is the reactive gas, and Ga$_2$O gas was used as the Ga source gas. NH$_3$ gas was used as the N source, and H$_2$ gas and N$_2$ gas were used as the carrier gases. A growth time was 1 to 3 hours. A polycrystal density was measured by observing a surface of a grown crystal with an optical microscope and counting the number of polycrystals per unit area (number/cm$^2$).

Example 1

Regarding growth conditions, the substrate temperature was 1200° C., and the raw material temperature was 1130° C. Regarding supply partial pressures, the Ga$_2$O gas partial pressure was 0.0076 atm, the H$_2$O gas partial pressure was 0.0152 atm, the NH$_3$ gas partial pressure was 0.0444 atm, the H$_2$ gas partial pressure was 0.9022 atm, and the N$_2$ gas partial pressure was 0.0305 atm. The supersaturation ratio in this case is $P^o/P^e=1.1$ from the equilibrium partial pressure $P^e$ of Ga$_2$O and the supply partial pressure $P^o$ of Ga$_2$O estimated from thermodynamic calculation. In this example, the decomposition suppression layer was not introduced.

As a result of growing GaN, the polycrystal density was 537 number/cm$^2$, and the growth rate was 32 μm/h.

Details of the thermodynamic calculation will hereinafter be described. Six gaseous species Ga$_2$O, NH$_3$, H$_2$O, H$_2$, Ga, and N$_2$ were taken into consideration along with one solid species GaN. The activity of the solid species GaN was approximated as 1. The partial pressures in the equilibrium state of these molecular species were obtained by simultaneously solving the following six equations (V) to (X).

$$K1 = (P^e_{H2O} \cdot P^e_{H2})/(P^e_{Ga2O} \cdot P^e_{NH3})^2 \quad \text{(V)}$$

$$K2 = ((P^e_{Ga})^2 \cdot P^e_{H2})/(P^e_{Ga2O} \cdot P^e_{H2}) \quad \text{(VI)}$$

$$\Sigma Pi = P_{eGa2O} + P^e_{NH3} + P^e_{H2O} + P^e_{H2} + P^e_{Ga} + P^e_{N2} \quad \text{(VII)}$$

$$0.5(P^o_{Ga2O} - P^e_{Ga2O}) + (P^o_{Ga} - P^e_{Ga}) = P^o_{NH3} - P^e_{NH3} \quad \text{(VIII)}$$

$$F = (1.5 P^e_{NH3} + P^e_{H2O} + P^e_{H2})/(1.5 P^e_{NH3} + P^e_{H2O} + P^e_{H2} + P^e_{N2}) \quad \text{(IX)}$$

$$A = (P^e_{Ga2O} + P^e_{H2O})/(P^e_{Ga2O} + P^e_{H2O} + P^e_{N2}) \quad \text{(X)}$$

$$K = \exp(\Delta G/R \cdot T) \quad \text{(XI)}$$

Eqs. (V) and (VI) are equations of equilibrium constants of Eqs. (III) and (IV). Values of equilibrium constants K1, K2 were calculated based on Gibbs potential of atoms and molecular species described in Prof. Dr. Ing. Ihsan. Barin, "Thermochemical Data of Pure Substances, Third Edition", Wiley-VCH Verlag GmbH, Apr. 24, 2008. The equilibrium constants can be represented by Eq. (XI), where ΔG is a difference in Gibbs potential before and after a reaction of each reaction formula, R is a gas constant, and T is a reaction temperature.

Eq. (VII) is an equation of a constant total pressure in a system. In this system, the pressure was considered as 1 atm.

Eq. (VIII) is an equation of a stoichiometric relationship. The calculation was performed on the assumption that the atomic ratio of Ga to N in GaN was 1:1.

Eq. (IX) is an equation representative of a ratio of the number of hydrogen atoms to hydrogen and $N_2$ serving as an inert gas in the system. It was assumed that the hydrogen atoms are not taken into the solid phase and are constant in the system. The value of F can uniquely be calculated by determining a value of the supply partial pressure.

Eq. (X) is an equation representative of a ratio of the number of oxygen atoms to oxygen and $N_2$ serving as an inert gas in the system. It was assumed that the oxygen atoms are not taken into the solid phase and the oxygen atoms are constant in the system. The value A can uniquely be calculated by determining a value of the supply partial pressure.

A supply partial pressure of each of the gaseous species was calculated as a ratio of each gas flow rate to the total flow rate of the gases flowing into the system. Regarding the supply partial pressure, the total pressure in the system was considered as 1 atm. For example, when the total flow rate into the system is X slm and a gas y is allowed to flow in at a gas flow rate of Y slm, the partial pressure of the gas y can be represented as (Y/X) atm.

Example 2

Regarding growth conditions, the substrate temperature was 1200° C., and the raw material temperature was 1130° C. The $Ga_2O$ gas partial pressure was 0.0076 atm, the $H_2O$ gas partial pressure was 0.0152 atm, the $NH_3$ gas partial pressure was 0.0444 atm, the $H_2$ gas partial pressure was 0.8067 atm, and the $N_2$ gas partial pressure was 0.1261 atm. The supersaturation ratio in this case is $P^o/P^e=1.3$ from the equilibrium partial pressure $P^e$ of $Ga_2O$ and the supply partial pressure $P^o$ of $Ga_2O$ estimated from the thermodynamic calculation. In Example 2, the decomposition suppression layer was not introduced.

As a result of growing GaN, the polycrystal density was 4 number/cm², and the growth rate was 43 μm/h.

Example 3

Regarding growth conditions, the substrate temperature was 1200° C., and the raw material temperature was 1130° C. The $Ga_2O$ gas partial pressure was 0.0076 atm, the $H_2O$ gas partial pressure was 0.0152 atm, the $NH_3$ gas partial pressure was 0.0444 atm, the $H_2$ gas partial pressure was 0.4578 atm, and the $N_2$ gas partial pressure was 0.4750 atm. The supersaturation ratio in this case is $P^o/P^e=3.4$ from the equilibrium partial pressure $P^e$ of $Ga_2O$ and the supply partial pressure $P^o$ of $Ga_2O$ estimated from the thermodynamic calculation. In Example 3, the decomposition suppression layer was not introduced.

As a result of growing GaN, the polycrystal density was 896 number/cm², and the growth rate was 61 μm/h.

Example 4

Regarding growth conditions, the substrate temperature was 1200° C., and the raw material temperature was 1130° C. The $Ga_2O$ gas partial pressure was 0.0004 atm, the $H_2O$ gas partial pressure was 0.0004 atm, the $NH_3$ gas partial pressure was 0.030 atm, the $H_2$ gas partial pressure was 0.3793 atm, and the $N_2$ gas partial pressure was 0.5899 atm. The supersaturation ratio in this case is $P^o/P^e=4.5$ from the equilibrium partial pressure $P^e$ of $Ga_2O$ and the supply partial pressure $P^o$ of $Ga_2O$ estimated from the thermodynamic calculation. In Example 4, the decomposition suppression layer was introduced. The decomposition suppression layer was introduced from the substrate temperature of 1050° C. and in a range of the supersaturation ratio of 1.3 or more and less than 2.5 so as to prevent polycrystallization.

Figure 3:
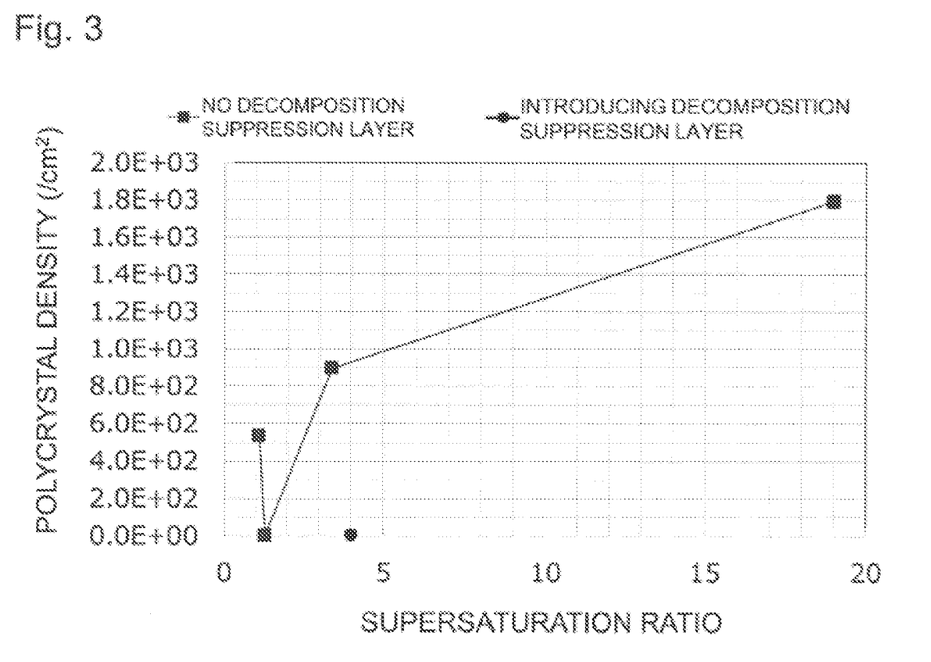
FIG. 3 is a diagram showing an experimental result showing a relationship between supersaturation ratio and polycrystal density.

As a result of growing GaN, the polycrystal density was 5 number/cm², and the growth rate was 60 μm/h. The polycrystal density was 920 number/cm² in the case of growing at the supersaturation ratio of 4.5 from a graph and was improved to about 1/100 by the decomposition suppression layer.

Comparative Example 1

Regarding growth conditions, the substrate temperature was 1200° C., and the raw material temperature was 1130° C. The $Ga_2O$ gas partial pressure was 0.0076 atm, the $H_2O$ gas partial pressure was 0.0152 atm, the $NH_3$ gas partial pressure was 0.1111 atm, the $H_2$ gas partial pressure was 0.4578 atm, and the $N_2$ gas partial pressure was 0.4083 atm. The supersaturation ratio in this case is $P^o/P^e=19$ from the equilibrium partial pressure $P^e$ of $Ga_2O$ and the supply partial pressure $P^o$ of $Ga_2O$ estimated from the thermodynamic calculation. In Comparative Example 1, the decomposition suppression layer was not introduced.

As a result of growing GaN, the polycrystal density was 1792 number/cm², and the growth rate was 71 μm/h.

Summary of Examples and Comparative Example

FIG. 3 shows a graph showing a relationship of the supersaturation ratio and the presence/absence of introduction of the decomposition suppression layer with the polycrystallization (polycrystal density). This graph is obtained by plotting and connecting the polycrystallinity and the value of the supersaturation ratio obtained from the examples with a straight line. As can be seen from this result, the polycrystal density of 896 number/cm² is achieved at the supersaturation ratio of 3.4, the polycrystal density of 4 number/cm² is achieved at the supersaturation ratio of 1.3, and the polycrystal density of 537 number/cm² is achieved at the supersaturation ratio of 1.1. For example, considering a pn junction diode that is an electronic device, an electrode size may be 50 μm or more in diameter in consideration of an applied current density. Considering the electrode size of 50 μm, the polycrystal density of 1019 number/cm² is converted to 0.02 in terms of the diameter of 50 μm. This value is favorable since the probability of an electrode portion coincident with a polycrystal region is 2%. In this case, from the graph, the polycrystal density of 1019 number/cm² can be achieved when the supersaturation ratio is 5 or less. The polycrystal density of 509 number/cm² is converted to 0.01 in terms of the diameter of 50 μm. This numerical value is more favorable since the probability of an electrode portion coincident with a polycrystal region is 1%. In this case, from the graph, the polycrystal density of 509 number/cm² can be achieved when the supersaturation ratio is 2.5 or less. The polycrystal density of 4 number/cm² results in a further favorable numerical value.

In this case, from the graph, the polycrystal density of 4 number/cm² can be achieved when the supersaturation ratio is 1.3. At the supersaturation ratio of 1, theoretically, no crystal grows.

In summary, the polycrystal density of 1019 number/cm² or less can be achieved by setting the supersaturation ratio greater than 1 and equal to or less than 5, the polycrystal density of 509 number/cm² or less can be achieved by setting the supersaturation ratio greater than 1 and equal to or less than 2.5, and the polycrystal density of 4 number/cm² or more and less than 509 number/cm² can be achieved by setting the supersaturation ratio equal to or greater than 1.3 and less than 2.5.

By further introducing the decomposition suppression layer, the polycrystal density can be reduced to about 1/100 from the graph.

The present disclosure includes appropriately combining any embodiments and/or examples out of the various embodiments and/or examples described above, and the effects of the respective embodiments and/or examples can be produced.

According to the method of manufacturing a group-III nitride crystal of the present invention, the polycrystallization is suppressed by controlling the supersaturation ratio ($P^o/P^e$) so that the quality of the obtained group-III nitride crystal can be improved.

EXPLANATIONS OF LETTERS OR NUMERALS 100 raw material chamber
101 raw material reaction chamber
102 first carrier gas supply port
103 reactive gas supply pipe
104 raw material boat
105 starting Ga source (starting group-III element source)
106 first heater
107 group-III oxide gas discharge port
108 group-III oxide gas and carrier gas discharge port
109 connection pipe
110 third heater
111 growth chamber
112 nitrogen element-containing gas supply port
113 oxidizable gas supply port
114 second carrier gas supply port
115 second heater
116 seed substrate
117 substrate susceptor
118 group-III oxide gas and carrier gas supply port
119 exhaust port
121 decomposition suppression layer
123 growth layer
125 abnormal growth source
126 polycrystal
127 pit
150 group-III nitride crystal manufacturing apparatus

What is claimed is:

1. A method of manufacturing a group-III nitride crystal comprising:
preparing a seed substrate; and
supplying a group-III element oxide gas and a nitrogen element-containing gas at a supersaturation ratio ($P^o/P^e$) greater than 1 and equal to or less than 5, then, growing a group-III nitride crystal on the seed substrate,
wherein the $P^o$ is a supply partial pressure of the group-III element oxide gas,
the $P^e$ is an equilibrium partial pressure of the group-III element oxide gas such that a first reaction and a second reaction are in equilibrium,
in the first reaction, the group-III nitride crystal is generated from the group-III element oxide gas and the nitrogen element-containing gas, and
in the second reaction, a group-III element gas is generated from decomposition reaction of the group-III element oxidation gas.

2. The method of manufacturing a group-III nitride crystal according to claim 1, wherein in the step of supplying the group-III element oxide gas and the nitrogen element-containing gas, the group-III element oxide gas and the nitrogen element-containing gas are supplied from a temperature lower than a substrate temperature of the growing step to introduce a group-III nitride crystal decomposition suppression layer.

3. The method of manufacturing a group-III nitride crystal according to claim 1, wherein in the step of supplying the group-III element oxide gas and the nitrogen element-containing gas, the supersaturation ratio ($P^o/P^e$) is set to equal to or greater than 1.3 and less than 2.5.

4. The method of manufacturing a group-III nitride crystal according to claim 1, wherein in the step of supplying the group-III element oxide gas and the nitrogen element-containing gas, the supersaturation ratio ($P^o/P^e$) is set to equal to or greater than 1.3 and less than 2.5, and
the group-III element oxide gas and the nitrogen element-containing gas are supplied from a substrate temperature of the seed substrate of 1050° C. or less to introduce a group-III nitride crystal decomposition suppression layer.

5. The method of manufacturing a group-III nitride crystal according to claim 1, wherein in the step of supplying the group-III element oxide gas and the nitrogen element-containing gas, the supersaturation ratio ($P^o/P^e$) is set to equal to or greater than 1.3 and less than 2.5, and
the group-III element oxide gas and the nitrogen element-containing gas are supplied from a substrate temperature of the seed substrate of 1000° C. or less to introduce a group-III nitride crystal decomposition suppression layer.

6. The method of manufacturing a group-III nitride crystal according to claim 1, wherein the $P^o$ is higher than or equal to 0.0004 atm and lower than or equal to 0.0076 atm.

* * * * *